United States Patent
Aizaki (10) Patent No.: US 6,392,240 B1
(45) Date of Patent: May 21, 2002

(54) SAMPLE TABLE FOR PATTERN EXPOSURE MACHINE

(75) Inventor: Naoaki Aizaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/262,866

(22) Filed: Mar. 5, 1999

(30) Foreign Application Priority Data

Mar. 5, 1998 (JP) .......................................... 10-053793

(51) Int. Cl.$^7$ ................................................ H01J 21/00
(52) U.S. Cl. ............................ 250/442.11; 250/441.11; 250/440.11
(58) Field of Search ................................ 378/208, 209; 250/453.11, 440.11, 442.11, 441.11

(56) References Cited

U.S. PATENT DOCUMENTS

| | | | | |
|---|---|---|---|---|
| 4,969,168 A | * | 11/1990 | Sakamoto et al. | 250/440.11 |
| 5,093,579 A | * | 3/1992 | Amemiya et al. | 250/440.11 |
| 5,191,218 A | * | 3/1993 | Mori et al. | 269/21 |
| 5,329,126 A | * | 7/1994 | Amemiya et al. | 250/440.11 |
| 5,540,126 A | * | 7/1996 | Piramoon | 83/34 |
| 5,544,213 A | * | 8/1996 | Chiba et al. | 378/205 |

FOREIGN PATENT DOCUMENTS

JP            63-260023          10/1988

OTHER PUBLICATIONS

A.C. Chen et al., "Magnification correction for proximity x-ray lithography", Proc. SPIE, vol. 2437, 1995, pp. 140–150 with abstract.

* cited by examiner

Primary Examiner—Kiet T. Nguyen
Assistant Examiner—David A. Vanore
(74) Attorney, Agent, or Firm—Sughrue Mion, PLLC (57) ABSTRACT

A sample table for use in a pattern exposure machine configured to transfer a circuit pattern formed in a mask onto a sample. The sample table is divided into a center part and a peripheral part surrounding the center part. The center part and the peripheral part include a chuck mechanism for attracting the sample, respectively. A portion or the whole of the peripheral part are movable in a radial direction of the sample table in a condition that the sample is attracted to the peripheral part of the sample table. Thus, the invention operates such that when the pattern on the sample has become smaller or larger than a mask pattern, the sample, such as a silicon substrate, is expanded or contracted for a shortened time to obtain a desired.

14 Claims, 6 Drawing Sheets

SAMPLE TABLE FOR PATTERN EXPOSURE MACHINE

BACKGROUND OF THE INVENTION

1. Field of the Invention

The present invention relates to a pattern exposure machine used in manufacturing a semiconductor integrated circuit and a LCD (liquid crystal display), and more specifically to a sample table for an X-ray exposure machine.

2. Description of Related Art

Recently, in order to elevate the integration density and the operation speed of the semiconductor integrated circuit, effort is continuously made to microminiaturize semiconductor device elements incorporated in the semiconductor integrated circuit. In addition, with microminiaturization of device elements, whether or not overlay precision between semiconductor device elements formed in various processes is satisfactory, has become very important. In ordinary cases, a required degree of the overlay precision is one-fourth to one-third of the size of the device elements. This means that, in a pattern formed by a recently developed 0.25 $\mu$m rule or 0.18 $\mu$m rule, the degree of overlay precision of 50 nm or 80 nm is required.

On the other hand, a silicon substrate used for manufacturing a semiconductor integrated circuit can slightly shorten (contract) or elongate (expand) because it is subjected to a heat change in a manufacturing process and because a thin film having an internal stress is deposited. For example, if a silicon nitride film having a thickness of 0.2 $\mu$m is deposited on a silicon wafer having a diameter of 6 inches, the shortening of 4 ppm occurs, namely, a pattern having a length of 20 mm becomes short by 80 nm. This shortening of 80 mm is comparable to the above mentioned required degree of overlay precision, and therefore, is a nonnegligible magnitude. Therefore, in a pattern transfer of a succeeding exposure process, it is necessary to conduct the exposure while compensating for the amount of shortening.

Furthermore, when an oxide silicon film having a thickness of 1.0 $\mu$m is deposited on the silicon substrate by a CVD (chemical vapor process), the elongation of 5 ppm occurs, namely, the pattern having the length of 20 mm becomes long by 100 nm. This elongation of 100 nm exceeds the above mentioned required degree of overlay precision, and therefore, is also a nonnegligible magnitude. Therefore, in a pattern transfer of a succeeding exposure process, it is necessary to conduct the exposure while compensating for the amount of elongation.

In the meanwhile, in a light exposure machine for conducting a reduction transfer of a mask pattern by use of ultraviolet rays, it is possible to slightly modify a transfer magnification from a predetermined value by adjusting a lens interval in a lens assembly of an optical system. Therefore, the compensation required in the exposure process as mentioned above can be easily realized.

However, in an X-ray exposure using as a light source a synchrotron orbital radiation (SOR) which is effective in forming a fine pattern which cannot be formed in the light exposure using the ultraviolet rays, since there is no lens which can be effectively used for the X-rays, a mask having the magnification of ×1 is used. Therefore, it is impossible to change the magnification in the pattern transfer.

Under the above mentioned circumstance, Japanese Patent Application Pre-examination Publication No. JP-A-63-260023 (an English abstract of JP-A-63-260023 is available and the content of the English abstract of JP-A-63-260023 is incorporated by reference in its entirety into this application) proposes to change the temperature of both of a mask supporting member and a sample substrate so as to carry out the compensation required in the exposure process, by paying attention to the fact that the mask supporting member (fused quartz) and the sample substrate (silicon) have different expansion coefficients. This will be called a "first prior art" hereinafter.

Furthermore, A. C. Chen et al, "Magnification correction for proximity x-ray lithography", Proc. SPIE, Vol.2437, pp140–150, 1995 (the content of which is incorporated by reference in its entirety into this application) proposes to apply an external force to a mask support member so as to forcibly elongate the mask thereby to carry out the compensation required in the exposure process. This will be called a "second prior art" hereinafter.

However, the first and second prior arts have the following problems:

In the first prior art, there is a variable factor of the machine itself caused by the temperature change of the mask supporting member and the sample substrate. Namely, the degree of precision lowers disadvantageously in a magnification deviation measuring means and in a position deviation measuring means. Furthermore, after the temperature is changed, a time of ten minutes to a few ten minutes is required until the temperature becomes stabilized, and therefore, the compensation amount cannot be modified for a short time.

In the second prior art, since it is necessary to apply the external force to the mask support member, the fatigue is liable to occur in the mask support member, and the mask itself or the mask support member is liable to be broken. In addition, since the external force is applied only in a direction of elongating the mask, application of the external force is limited to only the case that the pattern formed on the sample is larger than the mask pattern. In other words, it is impossible to comply with the case that the pattern formed on the sample is smaller than the mask pattern.

Thus, in order to carry out the adjustment for a short time for the purpose of meeting with the expansion of the sample silicon substrate, the application of the external force is more advantageous than the changing of the temperature. However, in the application of the external force to the mask support member, the mask itself or the mask support member is liable to be broken.

SUMMARY OF THE INVENTION

Accordingly, it is an object of the present invention to provide a sample table for a pattern exposure machine, which has overcome the above mentioned problems of the prior art.

Another object of the present invention is to provide a sample table for a pattern exposure machine, effectively used particularly in an X-ray exposure machine, capable of precisely matching the pattern already formed on a sample substrate with a mask pattern by applying an external force to the sample substrate.

The above and other objects of the present invention are achieved in accordance with the present invention by a sample table for use in a pattern exposure machine configured to transfer a circuit pattern formed in a mask onto a sample, the sample table being so constructed that the sample is placed on the sample table, the sample table being divided into a center part and a peripheral part surrounding the center part, the sample table comprising a means for radially displacing at least a portion of the peripheral part in a condition that the sample is attracted to the sample table.

DESCRIPTION OF THE PREFERRED EMBODIMENTS

Now, embodiments of the sample table in accordance with the present invention for the pattern exposure machine will be described with reference to the drawings.

First Embodiment

Figure 1:
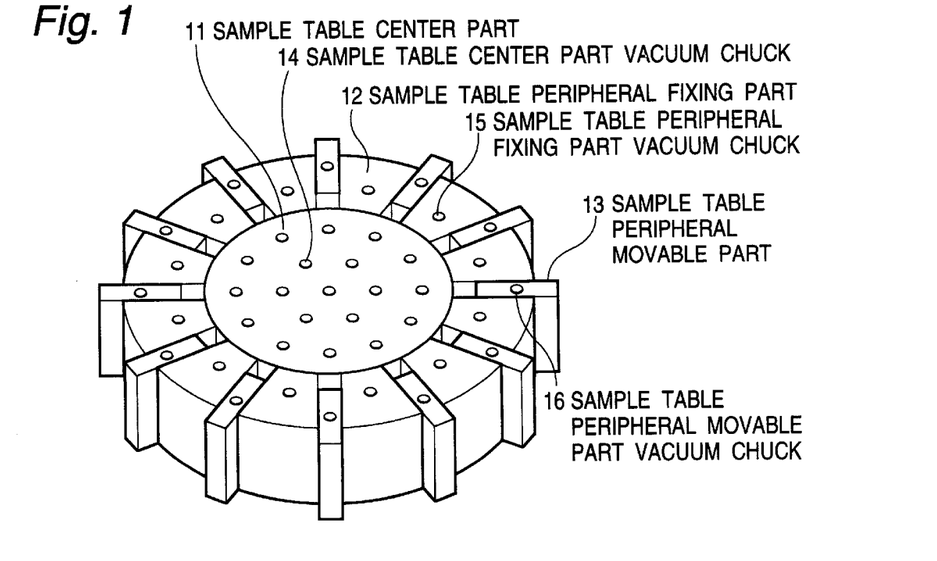
FIG. 1 is a diagrammatic perspective view illustrating the structure of an essential part of a first embodiment of the sample table in accordance with the present invention for the pattern exposure machine.
Figure 2:
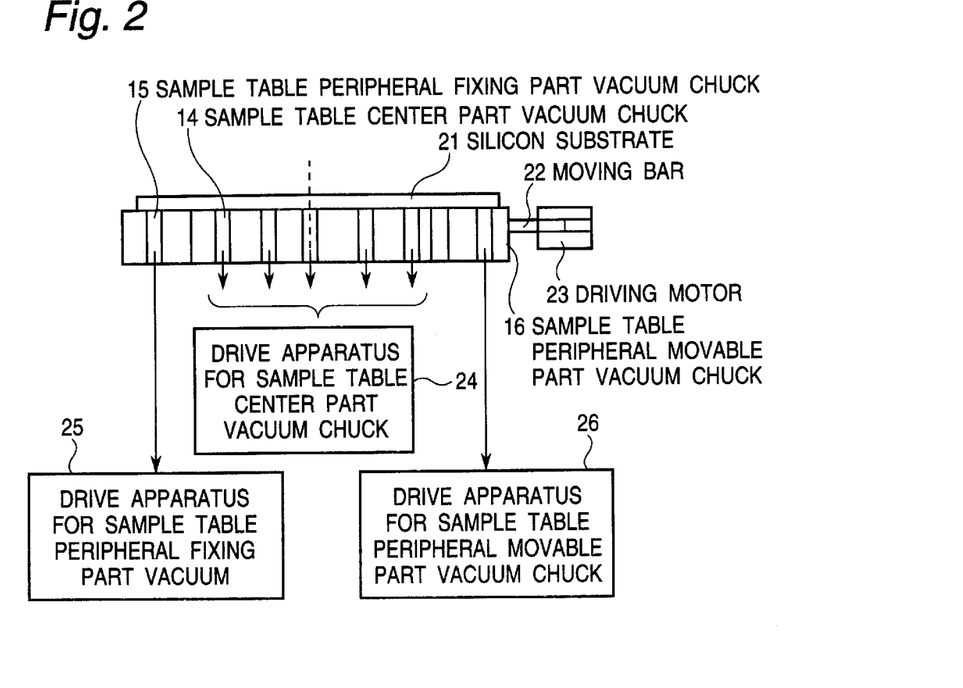
FIG. 2 is a diagrammatic sectional view illustrating the whole structure of the first embodiment of the sample table for the pattern exposure machine shown in FIG. 1.

FIGS. 1 and 2 are a diagrammatic perspective view and a diagrammatic sectional view, illustrating a first embodiment of the sample table in accordance with the present invention for the pattern exposure machine.

As shown in FIG. 1, in the first embodiment of the sample table for the pattern exposure machine, the sample table is divided into a sample table center part 11, a sample table peripheral fixed part 12 and a plurality of sample table peripheral movable parts 13, which include chucks for holding and fixing a silicon substrate (wafer) 21, as shown in FIG. 2, by means of vacuum suction, namely, sample table center part vacuum chucks 14, sample table peripheral fixed part vacuum chucks 15 and sample table peripheral movable part vacuum chucks 16, respectively.

The sample table peripheral fixed part 12 and the plurality of sample table peripheral movable parts 13 are provided at a periphery of the sample table center part 11. In other words, the sample table center part 11 is surrounded by the sample table peripheral fixed part 12 and the plurality of sample table peripheral movable parts 13. The plurality of sample table peripheral movable parts 13 are located in the sample table peripheral fixed part 12 at equal angular intervals along the circumstance to extend in a radial direction, as shown in FIG. 1.

Furthermore, as shown in FIG. 2, the sample table peripheral movable part 13 is movable in a radial direction of the sample table, by means of an axially moving bar 22 driven by a driving motor 23. The sample table center part vacuum chucks 14, the sample table peripheral fixed part vacuum chucks 15 and the sample table peripheral movable part vacuum chucks 16 are vacuum-sucked by a sample table center part vacuum chuck suction drive apparatus 24, a sample table peripheral fixed part vacuum chuck suction drive apparatus 25 and a sample table peripheral movable part vacuum chuck suction drive apparatus 26, respectively, which are operated independently of each other.

In this embodiment of the sample table for the pattern exposure machine having the above mentioned structure, when a silicon substrate (wafer) has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table (namely, a center axis of the sample table center part 11), and in this condition, the sample table center part vacuum chuck suction drive apparatus 24 is driven so that the sample table center part vacuum chucks 14 are driven to suck the silicon substrate 21 to the sample table center part 11. Then, the sample table peripheral movable part vacuum chuck suction drive apparatus 26 is driven so that the sample table peripheral movable part vacuum chucks 16 are driven to suck the silicon substrate 21 to the sample table peripheral movable parts 13. Thereafter, the sample table center part vacuum chuck suction drive apparatus 24 is stopped, so that the vacuum suction function of the sample table center part vacuum chucks 14 is stopped. Thus, the silicon substrate 21 is vacuum-sucked by only the sample table peripheral movable part vacuum chucks 16. In this condition, the driving motor 23 is driven so that the individual sample table peripheral movable parts 13 are displaced in a radially outward direction by the moving bar 22. If all the sample table peripheral movable parts 13 are displaced by the same predetermined distance, the silicon substrate 21 is uniformly expanded, with the result that the slightly contracted silicon substrate 21 is restored to the original size. In this condition, the sample table center part vacuum chuck suction drive apparatus 24 and the sample table peripheral fixed part vacuum chuck suction drive apparatus 25 are driven so that sample table center part vacuum chucks 14 and the sample table peripheral fixed part vacuum chucks 15 are driven, with the result that the whole of the silicon substrate 21 is vacuum-sucked and held on the sample table.

In this embodiment, the silicon substrate 21 can be contracted or expanded by a predetermined length by controlling the power supplied to the driving motor and/or the time of supplying the power to the driving motor. In addition, whether or not the silicon substrate 21 has been contracted or expanded by a predetermined length, is discriminated by monitoring a mark (not shown) previously formed on the silicon substrate 21 by monitoring the mark by use of a monitor apparatus (not shown).

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in this condition, the sample table center part vacuum chuck suction drive apparatus 24 is driven so that the sample table center part vacuum chucks 14 are driven to suck the silicon substrate 21 to the sample table center part 11. Then, the sample table peripheral movable part vacuum chuck suction drive apparatus 26 is driven so that the sample table peripheral movable part vacuum chucks 16 are driven to suck the silicon substrate 21 to the sample table peripheral movable parts 13. Thereafter, the sample table center part vacuum chuck suction drive apparatus 24 is stopped, so that the vacuum suction function of the sample table center part vacuum chucks 14 is stopped. Thus, the silicon substrate 21 is vacuum-sucked by only the sample table peripheral movable part vacuum chucks 16. In this condition, the driving motor 23 is driven so that the individual sample table peripheral movable parts 13 are displaced in a radially inward direction by the moving bar 22. If all the sample table peripheral movable parts 13 are displaced by the same predetermined distance, the silicon substrate 21 is uniformly contracted, with the result that the slightly expanded silicon substrate 21 is restored to the original size. In this condition, the sample table center part vacuum chuck suction drive apparatus 24 and the sample table peripheral fixed part vacuum chuck suction drive apparatus 25 are driven so that sample table center part vacuum chucks 14 and the sample table peripheral fixed part vacuum chucks 15 are driven, with the result that the whole of the silicon substrate 21 is vacuum-sucked and held on the sample table.

In this embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

Second Embodiment

A second embodiment of the sample table in accordance with the present invention for the pattern exposure machine will be described with reference to FIGS. 3 and 4.

Figure 3:
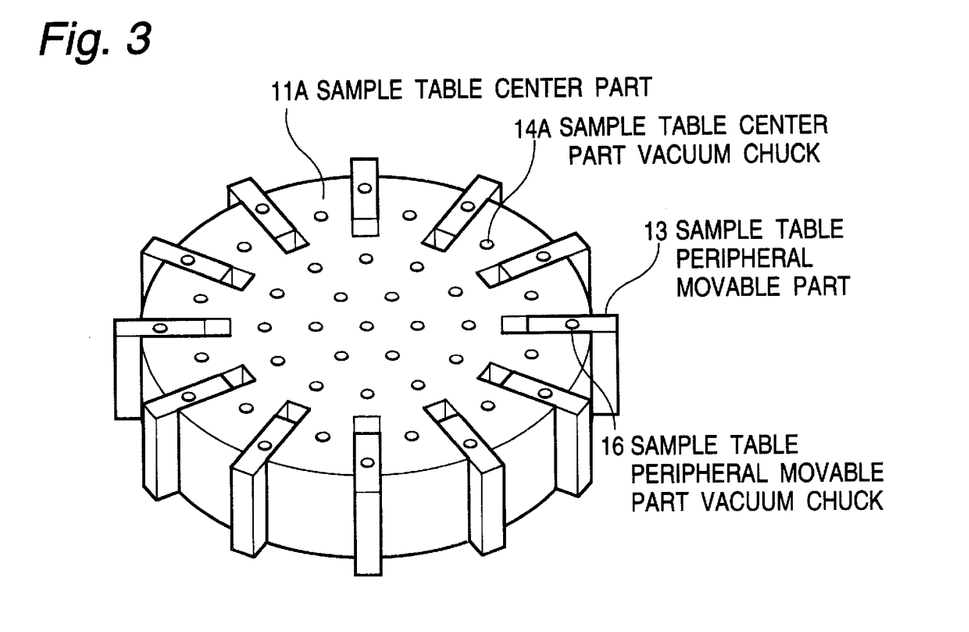
FIG. 3 is a diagrammatic perspective view illustrating the structure of an essential part of a second embodiment of the sample table in accordance with the present invention for the pattern exposure machine.

As shown in FIG. 3, in the second embodiment of the sample table for the pattern exposure machine, the sample table is divided into a sample table center part 11A and a plurality of sample table peripheral movable parts 13 provided to surround the sample table center part 11A and located at equal angular intervals. The sample table center part 11A and the sample table peripheral movable parts 13 include chucks for holding and fixing a silicon substrate (wafer) 21 by means of vacuum suction, namely, sample table center part vacuum chucks 14A and sample table peripheral movable part vacuum chucks 16, respectively. As seen from comparison between the first and second embodiments, the sample table center part 11A corresponds to one which is obtained by integrating the sample table center part 11 and the sample table peripheral fixed part 12 of the first embodiment. The sample table center part vacuum chucks 14A corresponds to a combination of the sample table center part vacuum chucks 14 and sample table peripheral fixed part vacuum chucks 15 of the first embodiment.

Figure 4:
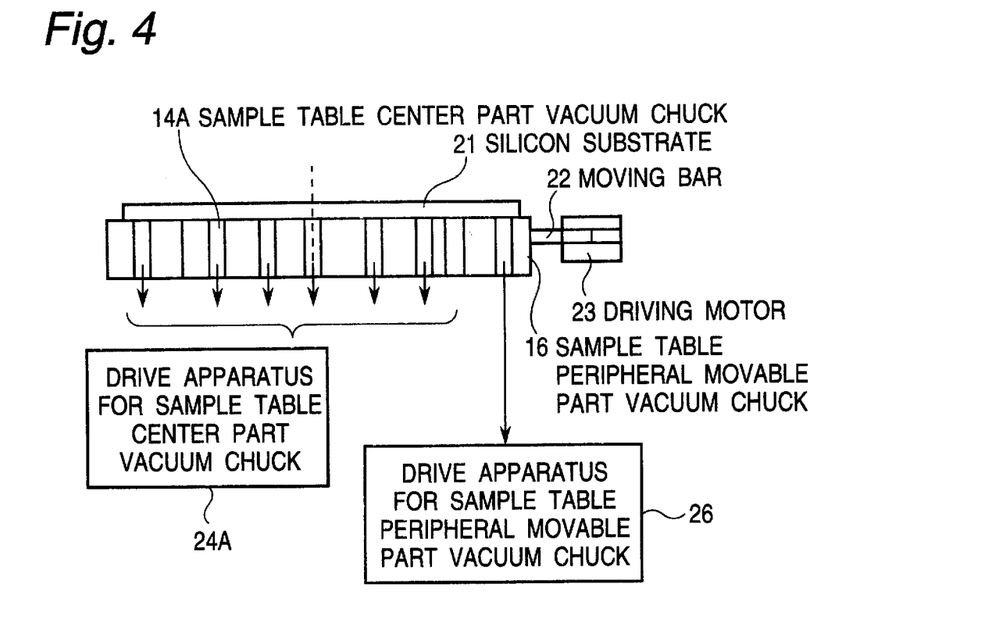
FIG. 4 is a diagrammatic sectional view illustrating the whole structure of the second embodiment of the sample table for the pattern exposure machine shown in FIG. 3.

Furthermore, as shown in FIG. 4, the sample table peripheral movable part 13 is movable in a radial direction of the sample table, by means of an axially moving bar 22 driven by a driving motor 23. The sample table center part vacuum chucks 14A and the sample table peripheral movable part vacuum chucks 16 are vacuum-sucked by a sample table center part vacuum chuck suction drive apparatus 24A and a sample table peripheral movable part vacuum chuck suction drive apparatus 26, respectively, which are operated independently of each other. As seen from comparison between the first and second embodiments, the sample table center part vacuum chuck suction drive apparatus 24A corresponds to a combination of the sample table center part vacuum chuck suction drive apparatus 24 and the sample table peripheral fixed part vacuum chuck suction drive apparatus 25 of the first embodiment.

In this embodiment of the sample table for the pattern exposure machine having the above mentioned structure, when a silicon substrate (wafer) 21 has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table, and in this condition, the sample table center part vacuum chuck suction drive apparatus 24A is driven so that the sample table center part vacuum chucks 14A are driven to suck the silicon substrate 21 to the sample table center part 11A. Then, the sample table peripheral movable part vacuum chuck suction drive apparatus 26 is driven so that the sample table peripheral movable part vacuum chucks 16 are driven to suck the silicon substrate 21 to the sample table peripheral movable parts 13. Thereafter, the sample table center part vacuum chuck suction drive apparatus 24A is stopped, so that the vacuum suction function of the sample table center part vacuum chucks 14A is stopped. Thus, the silicon substrate 21 is vacuum-sucked by only the sample table peripheral movable part vacuum chucks 16. In this condition, the driving motor 23 is driven so that the individual sample table peripheral movable parts 13 are displaced in a radially outward direction by the moving bar 22. If all the sample table peripheral movable parts 13 are displaced by the same predetermined distance, the silicon substrate 21 is uniformly expanded, with the result that the slightly contracted silicon substrate 21 is restored to the original size. In this condition, the sample table center part vacuum chuck suction drive apparatus 24A is driven so that sample table center part vacuum chucks 14A is driven, with the result that the whole of the silicon substrate 21 is vacuum-sucked and held on the sample table.

In this embodiment, the silicon substrate 21 can be contracted or expanded by a predetermined length by controlling the power supplied to the driving motor and/or the time of supplying the power to the driving motor. In addition, whether or not the silicon substrate 21 has been contracted or expanded by a predetermined length, is discriminated by monitoring a mark (not shown) previously formed on the silicon substrate 21 by monitoring the mark by use of a monitor apparatus (not shown).

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in this condition, the sample table center part vacuum chuck suction drive apparatus 24A is driven so that the sample table center part vacuum chucks 14A are driven to suck the silicon substrate 21 to the sample table center part 11A. Then, the sample table peripheral movable part vacuum chuck suction drive apparatus 26 is driven so that the sample table peripheral movable part vacuum chucks 16 are driven to suck the silicon substrate 21 to the sample table peripheral movable parts 13. Thereafter, the sample table center part vacuum chuck suction drive apparatus 24A is stopped, so that the vacuum suction function of the sample table center part vacuum chucks 14A is stopped. Thus, the silicon substrate 21 is vacuum-sucked by only the sample table peripheral movable part vacuum chucks 16. In this condition, the driving motor 23 is driven so that the individual sample table peripheral movable parts 13 are displaced in a radially inward direction by the moving bar 22. If all the sample table peripheral movable parts 13 are displaced by the same predetermined distance, the silicon substrate 21 is uniformly contracted, with the result that the slightly expanded silicon substrate 21 is restored to the original size. In this condition, the sample table center part vacuum chuck suction drive apparatus 24A is driven so that sample table center part vacuum chucks 14A are driven, with the result that the whole of the silicon substrate 21 is vacuum-sucked and held on the sample table.

In this embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

In addition, in the above mentioned second embodiment, the vacuum chucks of the sample table center part 11A positioned between the sample table peripheral movable parts 13 and the other vacuum chucks of the sample table center part 11A are controlled in common. However, it is not limited to this fashion. For example, the vacuum chucks of the sample table center part 11A positioned between the sample table peripheral movable parts 13 and the other vacuum chucks of the sample table center part 11A can be controlled independently of each other, similarly to the first embodiment.

Third Embodiment

A third embodiment of the sample table in accordance with the present invention for the pattern exposure machine will be described with reference to FIGS. 5 and 6.

Figure 5:
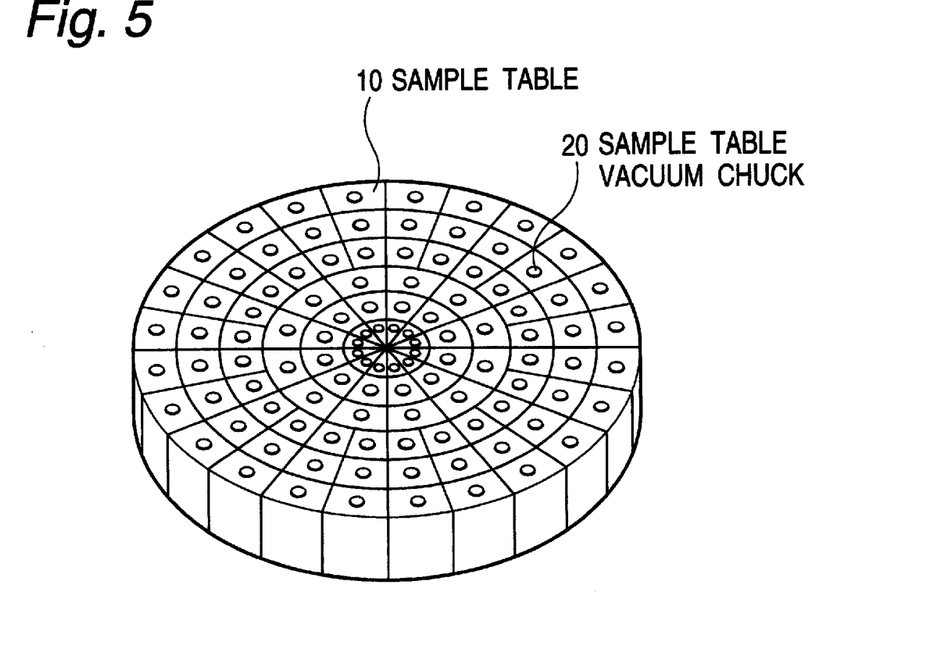
FIG. 5 is a diagrammatic perspective view illustrating the structure of an essential part of a third embodiment of the sample table in accordance with the present invention for the pattern exposure machine.
Figure 6:
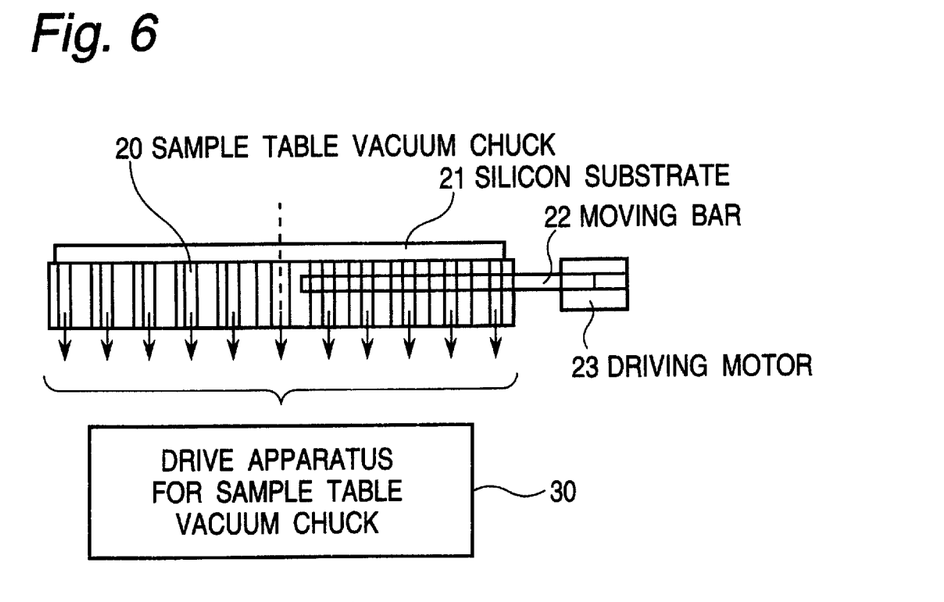
FIG. 6 is a diagrammatic sectional view illustrating the whole structure of the third embodiment of the sample table for the pattern exposure machine shown in FIG. 5.

As shown in FIG. 5, in the third embodiment of the sample table for the pattern exposure machine, the sample table 10 is finally divided into a number of sample table pieces, each of which includes a sample table vacuum chuck 20. The sample table pieces are so located that a plurality of sample table pieces are arranged in a radial direction and a plurality of sample table pieces are arranged in a circumferential direction. Only a center sample table piece of the sample table pieces of the sample table 10 is fixed, and each of the other sample table pieces of the sample table 10 is coupled to an axially moving bar 22 driven by a driving motor 23 as shown in FIG. 6, so that the other sample table pieces of the sample table 10 are simultaneously moved in a radial direction of the sample table. Furthermore, as shown in FIG. 6, all the sample table vacuum chucks 20 are vacuum-sucked by a common sample table vacuum chuck suction drive apparatus 30.

In this embodiment of the sample table for the pattern exposure machine having the above mentioned structure, when a silicon substrate (wafer) 21 has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table 10, and in this condition, the sample table vacuum chuck suction drive apparatus 30 is driven so that the sample table vacuum chucks 20 are driven to suck the silicon substrate 21 to the sample table 10. Thus, the silicon substrate 21 is vacuum-sucked and held by all the sample table vacuum chucks 20. In this condition, the driving motor 23 is driven so that the individual sample table pieces are displaced in a radially outward direction by the moving bar 22. If all the movable sample table pieces are displaced by respective predetermined distances, the silicon substrate 21 is uniformly expanded, with the result that the slightly contracted silicon substrate 21 is restored to the original size.

In this embodiment, it is so designed that each of the sample table pieces of the sample table 10 displaces with a different ratio to the displacement amount of the moving bar 22 so that the displacement amount of each of the sample table pieces becomes different in accordance with a distance from the center of the sample table. For this purpose, this embodiment is so constructed that the moving bar 22 in the form of a circular rod is caused to rotate by means of the driving motor 23, and on the other hand, a gear (not shown) provided to each sample table piece is in mating with a worm gear (not shown) formed on a surface of the moving bar 22, so that each sample table piece is displaced by rotation of the moving bar 22. In this construction, the gear ratio of each sample table piece is changed in accordance with a distance from the center of the sample table.

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in this condition, the sample table vacuum chuck suction drive apparatus 30 is driven so that the sample table vacuum chucks 20 are driven to suck the silicon substrate 21 to the sample table 10. Thus, the silicon substrate 21 is vacuum-sucked and held by the sample table vacuum chucks 20. In this condition, the driving motor 23 is driven so that the individual sample table pieces are displaced in a radially inward direction by the moving bar 22. If all the movable sample table pieces are displaced by respective predetermined distances, the silicon substrate 21 is uniformly contracted, with the result that the slightly expanded silicon substrate 21 is restored to the original size.

In this embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

Fourth Embodiment

A fourth embodiment of the sample table in accordance with the present invention for the pattern exposure machine will be described with reference to FIGS. 7 and 8.

Figure 7:
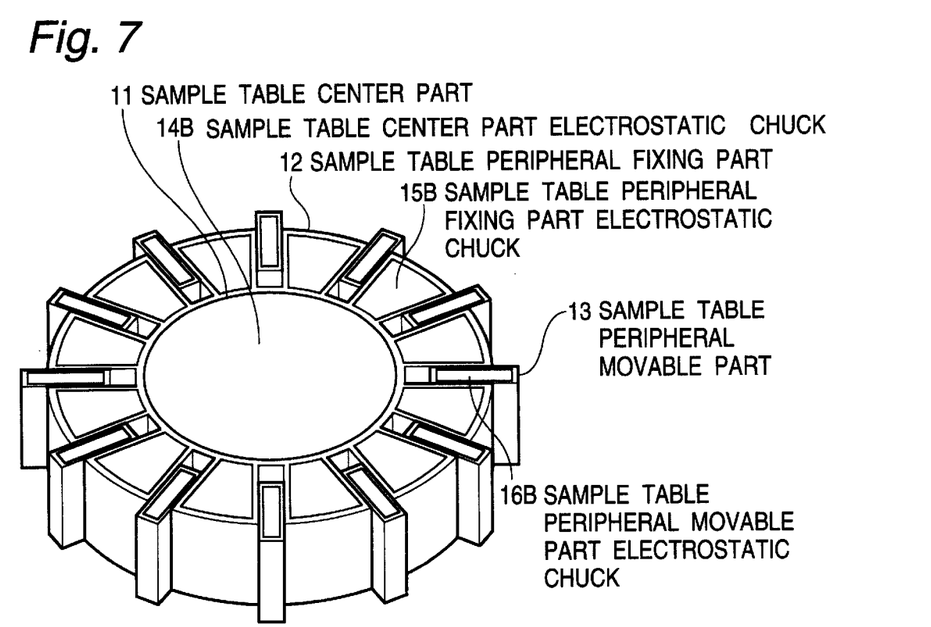
FIG. 7 is a diagrammatic perspective view illustrating the structure of an essential part of a fourth embodiment of the sample table in accordance with the present invention for the pattern exposure machine.
Figure 8:
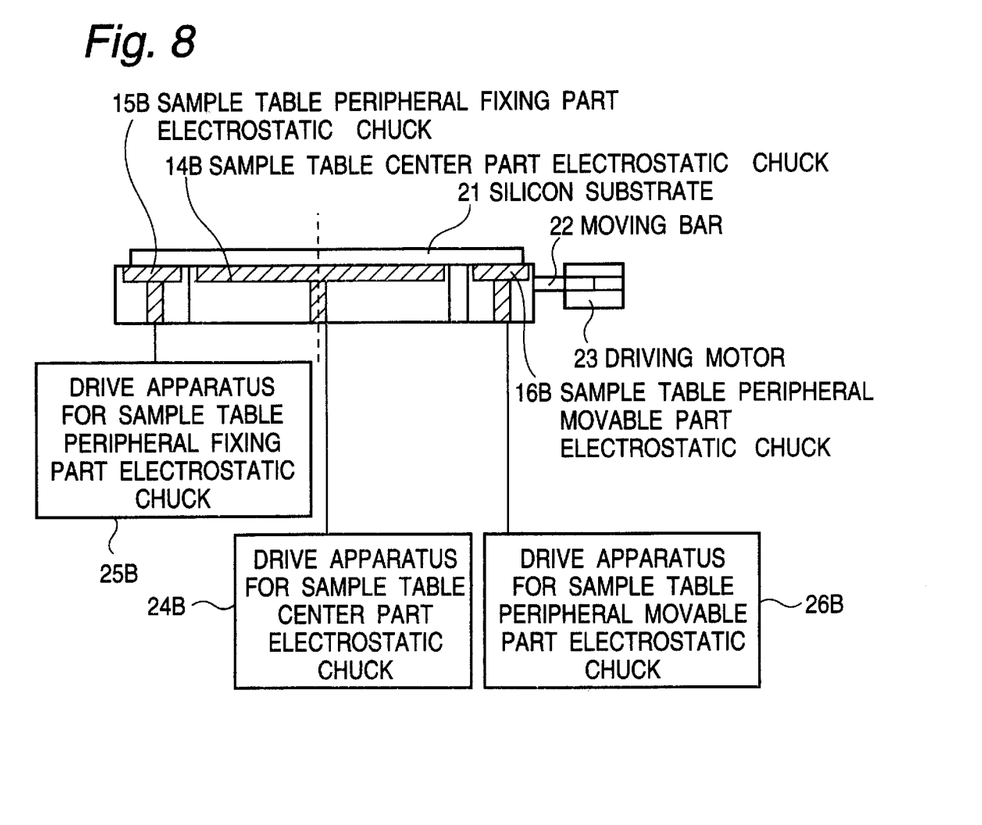
FIG. 8 is a diagrammatic sectional view illustrating the whole structure of the fourth embodiment of the sample table for the pattern exposure machine shown in FIG. 7.

As shown in FIG. 7, in the fourth embodiment of the sample table for the pattern exposure machine, the sample table is divided into a sample table center part 11, a sample table peripheral fixed part 12 and a plurality of sample table peripheral movable parts 13, which include chucks for electrostatically attracting and fixing a silicon substrate (wafer) 21, namely, a sample table center part electrostatic chuck 14B, sample table peripheral fixed part electrostatic chucks 15B and sample table peripheral movable part electrostatic chucks 16B, respectively. Furthermore, as shown in FIG. 8, the sample table peripheral movable part 13 is movable in a radial direction of the sample table, by means of an axially moving bar 22 driven by a driving motor 23. The sample table center part electrostatic chuck 14B, the sample table peripheral fixed part electrostatic chucks 15B and the sample table peripheral movable part electrostatic chucks 16B are electrostatically driven by a sample table center part electrostatic chuck drive apparatus 24B, a sample table peripheral fixed part electrostatic chuck drive apparatus 25B and a sample table peripheral movable part electrostatic chuck drive apparatus 26B, respectively, which are operated independently of each other.

As seen from comparison between the first and fourth embodiments, the fourth embodiment of the sample table for the pattern exposure machine is featured in that an electrostatic chuck is used in place of the vacuum chuck in the first embodiment.

In this embodiment of the sample table for the pattern exposure machine having the above mentioned structure, when a silicon substrate (wafer) 21 has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table, and in this condition, the sample table center part electrostatic chuck drive apparatus 24B is driven so that the sample table center part electrostatic chuck 14B is driven to electrostatically attract the silicon substrate 21 to the sample table center part 11. Then, the sample table peripheral movable part electrostatic chuck drive apparatus 26B is driven so that the sample table peripheral movable part electrostatic chucks 16B are driven to electrostatically attract the silicon substrate 21 to the sample table peripheral movable parts 13. Thereafter, the sample table center part electrostatic chuck drive apparatus 24B is stopped, so that the electrostatic attraction function of the sample table center part electrostatic chuck 14B is stopped. Thus, the silicon substrate 21 is electrostatically attracted by only the sample table peripheral movable part electrostatic chucks 16B. In this condition, the driving motor 23 is driven so that the individual sample table peripheral movable parts 13 are displaced in a radially outward direction by the moving bar 22. If all the sample table peripheral movable parts 13 are displaced by the same predetermined distance, the silicon substrate 21 is uniformly expanded, with the result that the slightly contracted silicon substrate 21 is restored to the original size. In this condition, the sample table center part electrostatic chuck drive apparatus 24B and the sample table peripheral fixed part electrostatic chuck drive apparatus 25B are driven so that sample table center part electrostatic chuck 14B and the sample table peripheral fixed part electrostatic chucks 15B are driven, with the result that the whole of the silicon substrate 21 is electrostatically attracted and held on the sample table.

Also in this embodiment, the silicon substrate 21 can be contracted or expanded by a predetermined length by controlling the power supplied to the driving motor and/or the time of supplying the power to the driving motor. In addition, whether or not the silicon substrate 21 has been contracted or expanded by a predetermined length, is discriminated by monitoring a mark (not shown) previously formed on the silicon substrate 21 by monitoring the mark by use of a monitor apparatus (not shown).

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in this condition, the sample table center part electrostatic chuck drive apparatus 24B is driven so that the sample table center part electrostatic chuck 14B is driven to electrostatically attract the silicon substrate 21 to the sample table center part 11. Then, the sample table peripheral movable part electrostatic chuck drive apparatus 26B is driven so that the sample table peripheral movable part electrostatic chucks 16B are driven to electrostatically attract the silicon substrate 21 to the sample table peripheral movable parts 13. Thereafter, the sample table center part electrostatic chuck drive apparatus 24B is stopped, so that the electrostatic attraction function of the sample table center part electrostatic chuck 14B is stopped. Thus, the silicon substrate 21 is electrostatically attracted by only the sample table peripheral movable part electrostatic chucks 16B. In this condition, the driving motor 23 is driven so that the individual sample table peripheral movable parts 13 are displaced in a radially inward direction by the moving bar 22. If all the sample table peripheral movable parts 13 are displaced by the same predetermined distance, the silicon substrate 21 is uniformly contracted, with the result that the slightly expanded silicon substrate 21 is restored to the original size. In this condition, the sample table center part electrostatic chuck drive apparatus 24B and the sample table peripheral fixed part electrostatic chuck drive apparatus 25B are driven so that sample table center part electrostatic chuck 14B and the sample table peripheral fixed part electrostatic chucks 15B are driven, with the result that the whole of the silicon substrate 21 is electrostatically attracted and held on the sample table.

In this fourth embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

Fifth Embodiment

A fifth embodiment of the sample table in accordance with the present invention for the pattern exposure machine will be described with reference to FIGS. 9 and 10.

Figure 9:
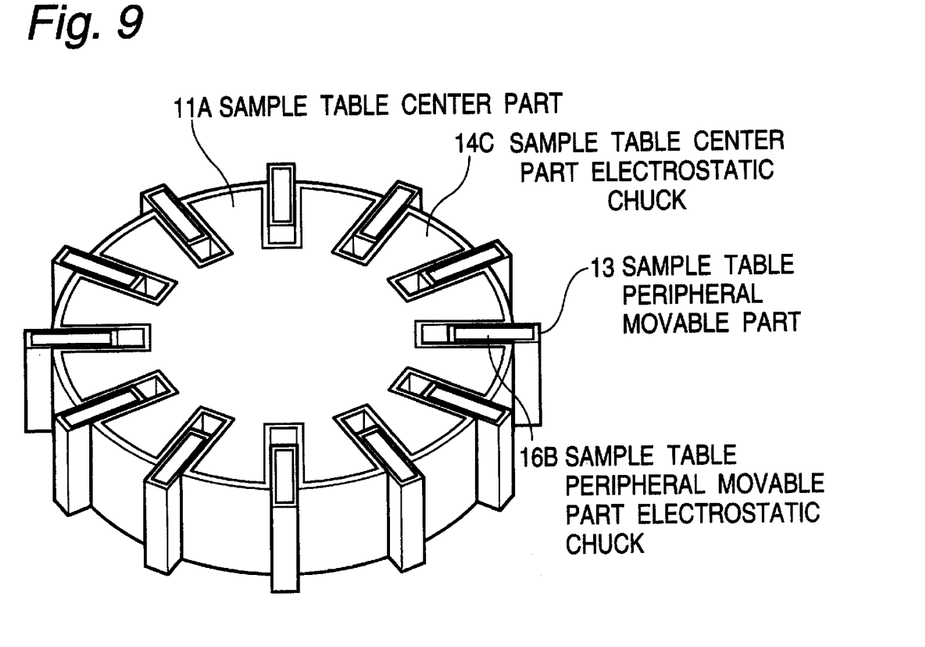
FIG. 9 is a diagrammatic perspective view illustrating the structure of an essential part of a fifth embodiment of the sample table in accordance with the present invention for the pattern exposure machine.

As shown in FIG. 9, in the fifth embodiment of the sample table for the pattern exposure machine, the sample table is divided into a sample table center part 11A and a plurality of sample table peripheral movable parts 13 provided to surround the sample table center part 11A and located at equal angular intervals. The sample table center part 11A and the sample table peripheral movable parts 13 include chucks for electrostatically attracting and fixing a silicon substrate (wafer) 21, namely, a sample table center part electrostatic chuck 14C and sample table peripheral movable part electrostatic chucks 16B, respectively. As seen from comparison between the fourth and fifth embodiments, the sample table center part 11A corresponds to one which is obtained by integrating the sample table center part 11 and the sample table peripheral fixed part 12 of the fourth embodiment. The sample table center part electrostatic chuck 14C corresponds to a combination of the sample table center part electrostatic chuck 14 and sample table peripheral fixed part electrostatic chucks 15B of the fourth embodiment.

Figure 10:
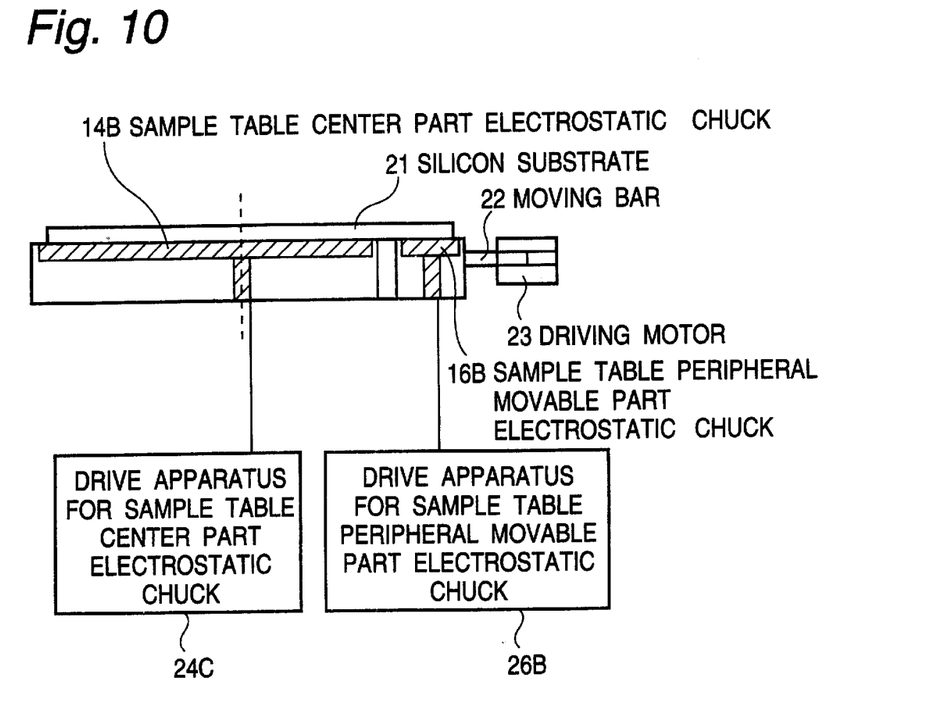
FIG. 10 is a diagrammatic sectional view illustrating the whole structure of the fifth embodiment of the sample table for the pattern exposure machine shown in FIG. 9.

Furthermore, as shown in FIG. 10, the sample table peripheral movable part 13 is movable in a radial direction of the sample table, by means of an axially moving bar 22 driven by a driving motor 23. The sample table center part electrostatic chuck 14C and the sample table peripheral movable part electrostatic chucks 16 are electrostatically driven by a sample table center part electrostatic chuck attraction drive apparatus 24C and a sample table peripheral movable part electrostatic chuck attraction drive apparatus 26B, respectively, which are operated independently of each other. As seen from comparison between the fourth and fifth embodiments, the sample table center part electrostatic chuck attraction drive apparatus 24C corresponds to a combination of the sample table center part electrostatic chuck attraction drive apparatus 24B and the sample table peripheral fixed part electrostatic chuck attraction drive apparatus 25B of the fourth embodiment.

In other words, as seen from comparison between the second and fifth embodiments, the fifth embodiment of the sample table for the pattern exposure machine is featured in that an electrostatic chuck is used in place of the vacuum chuck in the second embodiment.

In this embodiment of the sample table for the pattern exposure machine having the above mentioned structure, when a silicon substrate (wafer) 21 has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table, and in this condition, the sample table center part electrostatic chuck attraction drive apparatus 24C is driven so that the sample table center part electrostatic chuck 14C is driven to electrostatically attract the silicon substrate 21 to the sample table center part 11A. Then, the sample table peripheral movable part electrostatic chuck attraction drive apparatus 26B is driven so that the sample table peripheral movable part electrostatic chucks 16B are driven to electrostatically attract the silicon substrate 21 to the sample table peripheral movable parts 13. Thereafter, the sample table center part electrostatic chuck attraction drive apparatus 24C is stopped, so that the electrostatic attraction function of the sample table center part electrostatic chucks 14C is stopped. Thus, the silicon substrate 21 is electrostatically attracted by only the sample table peripheral movable part electrostatic chucks 16B. In this condition, the driving motor 23 is driven so that the individual sample table peripheral movable parts 13 are displaced in a radially outward direction by the moving bar 22. If all the sample table peripheral movable parts 13 are displaced by the same predetermined distance, the silicon substrate 21 is uniformly expanded, with the result that the slightly contracted silicon substrate 21 is restored to the original size. In this condition, the sample table center part electrostatic chuck attraction drive apparatus 24C is driven so that sample table center part electrostatic chuck 14C is driven, with the result that the whole of the silicon substrate 21 is electrostatically attracted and held on the sample table.

Also in this embodiment, the silicon substrate 21 can be contracted or expanded by a predetermined length by controlling the power supplied to the driving motor and/or the time of supplying the power to the driving motor. In addition, whether or not the silicon substrate 21 has been contracted or expanded by a predetermined length, is discriminated by monitoring a mark (not shown) previously formed on the silicon substrate 21 by monitoring the mark by use of a monitor apparatus (not shown).

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in this condition, the sample table center part electrostatic chuck attraction drive apparatus 24C is driven so that the sample table center part electrostatic chuck 14C is driven to electrostatically attract the silicon substrate 21 to the sample table center part 11A. Then, the sample table peripheral movable part electrostatic chuck attraction drive apparatus 26B is driven so that the sample table peripheral movable part electrostatic chucks 16B are driven to electrostatic attract the silicon substrate 21 to the sample table peripheral movable parts 13. Thereafter, the sample table center part electrostatic chuck attraction drive apparatus 24C is stopped, so that the electrostatic attraction function of the sample table center part electrostatic chuck 14C is stopped. Thus, the silicon substrate 21 is electrostatically attracted and held by only the sample table peripheral movable part electrostatic chucks 16B. In this condition, the driving motor 23 is driven so that the individual sample table peripheral movable parts 13 are displaced in a radially inward direction by the moving bar 22. If all the sample table peripheral movable parts 13 are displaced by the same predetermined distance, the silicon substrate 21 is uniformly contracted, with the result that the slightly expanded silicon substrate 21 is restored to the original size. In this condition, the sample table center part electrostatic chuck attraction drive apparatus 24C is driven so that sample table center part electrostatic chuck 14C is driven, with the result that the whole of the silicon substrate 21 is electrostatic-attracted and held on the sample table.

In this embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

In addition, in the above mentioned fifth embodiment, the electrostatic chuck portion of the sample table center part 11A positioned between the sample table peripheral movable parts 13 and the other electrostatic chuck portion of the sample table center part 11A are controlled in common. However, it is not limited to this fashion. For example, the electrostatic chuck portion of the sample table center part 11A positioned between the sample table peripheral movable parts 13 and the other electrostatic chuck portion of the sample table center part 11A can be controlled independently of each other, similarly to the fourth embodiment.

Sixth Embodiment

A sixth embodiment of the sample table in accordance with the present invention for the pattern exposure machine will be described with reference to FIGS. 11 and 12.

Figure 11:
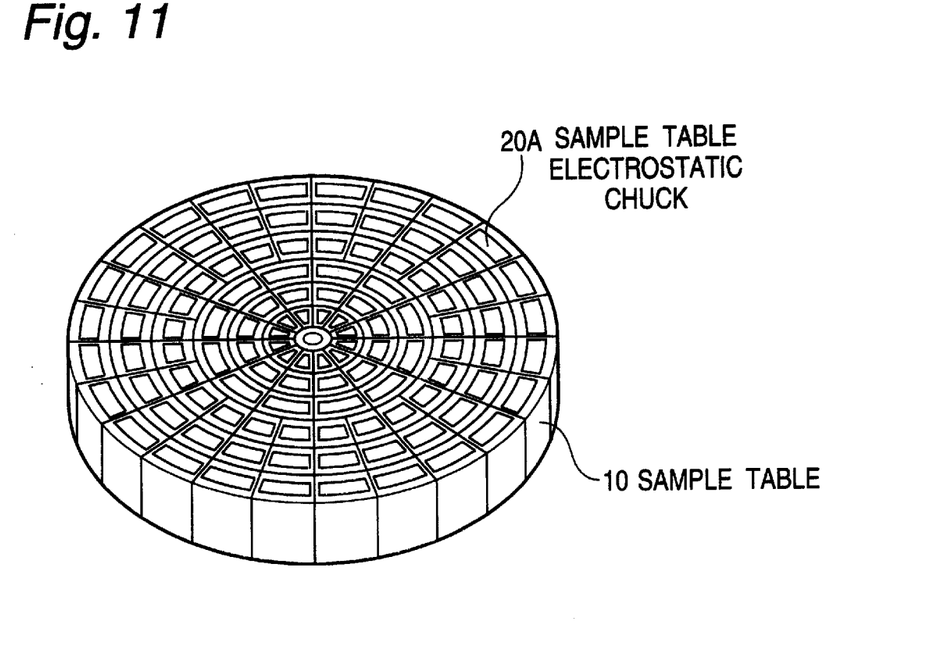
FIG. 11 is a diagrammatic perspective view illustrating the structure of an essential part of a sixth embodiment of the sample table in accordance with the present invention for the pattern exposure machine.
Figure 12:
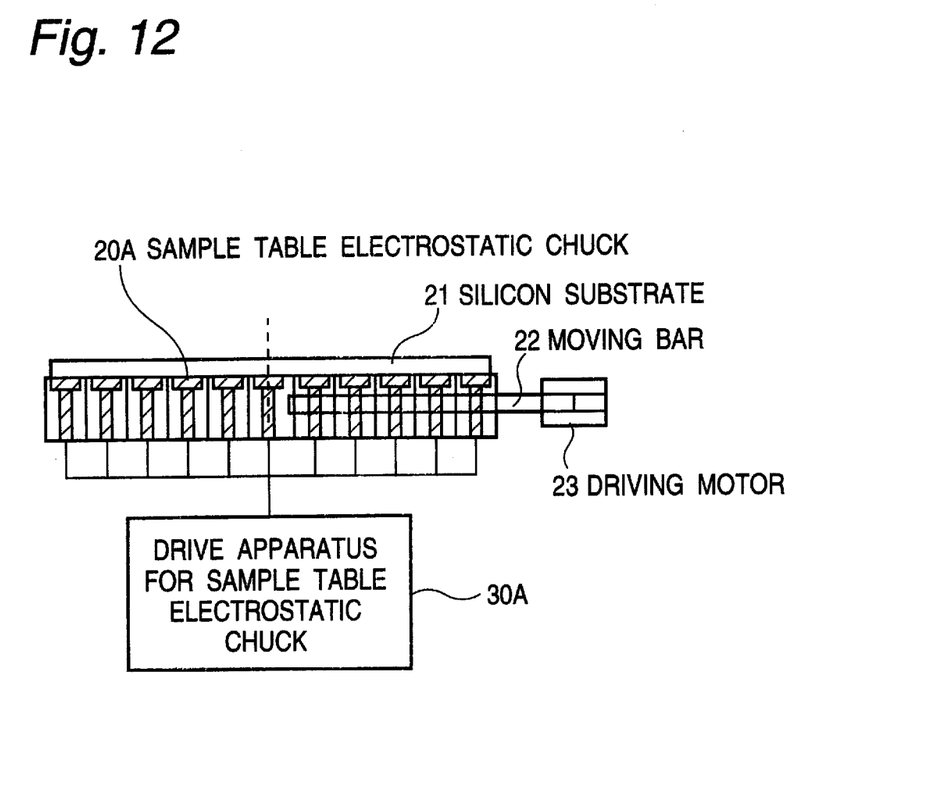
FIG. 12 is a diagrammatic sectional view illustrating the whole structure of the sixth embodiment of the sample table for the pattern exposure machine shown in FIG. 11.

As shown in FIG. 11, in the sixth embodiment of the sample table for the pattern exposure machine, the sample table 10 is finally divided into a number of sample table pieces, each of which includes a sample table electrostatic chuck 20A. The sample table pieces are so located that a plurality of sample table pieces are arranged in a radial direction and a plurality of sample table pieces are arranged in a circumferential direction. Only a center sample table piece of the sample table pieces of the sample table 10 is fixed, and each of the other sample table pieces of the sample table 10 is coupled to an axially moving bar 22 driven by a driving motor 23 as shown in FIG. 12, so that the other sample table pieces of the sample table 10 are simultaneously moved in a radial direction of the sample table. Furthermore, as shown in FIG. 12, all the sample table electrostatic chucks 20A are electrostatically driven by a common sample table electrostatic chuck attraction drive apparatus 30A.

As seen from comparison between the third and sixth embodiments, the sixth embodiment of the sample table for the pattern exposure machine is featured in that an electrostatic chuck is used in place of the vacuum chuck in the third embodiment.

In this embodiment of the sample table for the pattern exposure machine having the above mentioned structure, when a silicon substrate (wafer) 21 has slightly shortened (contracted) in the course of a semiconductor integrated circuit manufacturing process because of a thermal change or formation of a thin film having an internal stress, the silicon substrate is elongated (expanded) to a necessary extent in the following procedures so that the silicon substrate is matched with a mask (not shown).

First, a center axis of the silicon substrate 21 is aligned with a center axis of the sample table 10, and in this condition, the sample table electrostatic chuck attraction drive apparatus 30A is driven so that the sample table electrostatic chucks 20A are driven to electrostatically attract the silicon substrate 21 to the sample table 10. Thus, the silicon substrate 21 is electrostatically attracted and held by all the sample table electrostatic chucks 20A. In this condition, the driving motor 23 is driven so that the individual sample table pieces are displaced in a radially outward direction by the moving bar 22. If all the movable sample table pieces are displaced by respective predetermined distances, the silicon substrate 21 is uniformly expanded, with the result that the slightly contracted silicon substrate 21 is restored to the original size.

In this embodiment, it is so designed that each of the sample table pieces of the sample table 10 displaces with a different ratio to the displacement amount of the moving bar 22 so that the displacement amount of each of the sample table pieces becomes different in accordance with a distance from the center of the sample table. For this purpose, this embodiment is so constructed that the moving bar 22 in the form of a circular rod is caused to rotate by means of the driving motor 23, and on the other hand, a gear (not shown) provided to each sample table piece is in mating with a worm gear (not shown) formed on a surface of the moving bar 22, so that each sample table piece is displaced by rotation of the moving bar 22. In this construction, the gear ratio of each sample table piece is changed in accordance with a distance from the center of the sample table.

In the above description, the case that the sample has been contracted has been explained. To the contrary, there is a case that the silicon substrate 21 has slightly elongated (expanded) in the course of the semiconductor integrated circuit manufacturing process because of a thermal change or formation of a thin film having an internal stress. In this case, the silicon substrate is shortened (contracted) to a necessary extent in the following procedures in this embodiment so that the silicon substrate is matched with a mask (not shown).

First, the center axis of the silicon substrate 21 is aligned with the center axis of the sample table, and in. this condition, the sample table electrostatic chuck attraction drive. apparatus 30A is driven so that the sample table electrostatic chucks 20A are driven to electrostatically attract the silicon substrate 21 to the sample table 10. Thus, the silicon substrate 21 is electrostatically attracted and held by the sample table electrostatic chucks 20A. In this condition, the driving motor 23 is driven so that the individual sample table pieces are displaced in a radially inward direction by the moving bar 22. If all the movable sample table pieces are displaced by respective predetermined distances, the silicon substrate 21 is uniformly contracted, with the result that the slightly expanded silicon substrate 21 is restored to the original size.

In this sixth embodiment, as mentioned above, even if the silicon substrate 21 is contracted and even if the silicon substrate 21 is expanded, the silicon substrate 21 can be restored to the original size so that when a pattern of a mask is projected onto the silicon substrate 21, a mismatch in size can be eliminated.

The invention has thus been shown and described with reference to the specific embodiments. However, it should be noted that the present invention is in no way limited to the details of the illustrated structures but changes and modifications may be made within the scope of the appended claims.

In the above mentioned embodiments, the sample was the silicon substrate. However, it is a matter of course that the sample table can be applied to other substrates. In addition, the exposure machine is not limited to only the X-ray exposure machine, but the sample table can be applied to machines other than the X-ray exposure machine.

As mentioned above, in the sample table in accordance with the present invention for the exposure machine configured to transfer a circuit pattern formed in a mask onto a sample, not only when the pattern on the sample has become larger than a mask pattern, but also when the pattern on the sample has become smaller than a mask pattern, it is possible to expand or contract the sample (such as the silicon substrate) for a shortened time, without deteriorating the degree of precision in a magnification deviation measuring means and in a position deviation measuring means, and with no fear of the destroy of the mask itself or the mask support member.

What is claimed is:

1. A sample table for use in a pattern exposure machine configured to transfer a circuit pattern formed in a mask onto a sample, the sample table comprising:

a center part;

a peripheral part surrounding said center part; and means for radially displacing at least a portion of said peripheral part when the sample is attached to the sample table such that a portion of the sample is moved in one of an outward and inward direction in relation to said center part, wherein the sample is attached to the sample table by a chuck mechanism so that the sample is deformed in a predetermined manner.

2. A sample table for use in a pattern exposure machine, claimed in claim 1, wherein said sample table comprises a planar surface which supports the sample.

3. A sample table for use in a pattern exposure machine configured to transfer a circuit pattern formed in a mask onto a sample, the sample table comprising:

a center part;

a peripheral part surrounding said center part;

a chuck mechanism disposed in each of said center part and said peripheral part which attach the sample; and means for radially displacing a portion or the whole of said peripheral part when the sample is attached to the sample table such that a portion of the sample is moved in one of an outward and inward direction in relation to said center part, wherein the sample is deformed in a predetermined manner.

4. A sample table for use in a pattern exposure machine, claimed in claim 3, wherein said sample is a silicon substrate.

5. A sample table for use in a pattern exposure machine, claimed in claim 3, wherein said peripheral part is divided into a peripheral fixed part and peripheral movable parts movable in a radial direction, and the sample table includes means for controlling said chuck mechanism of said center part and said chuck mechanism of said peripheral fixed part, independently of each other.

6. A sample table for use in a pattern exposure machine, claimed in claim 3, wherein said peripheral part is divided into a peripheral fixed part and peripheral movable parts movable in a radial direction, said peripheral fixed part being integral with said center part, and the sample table includes means for simultaneously controlling said chuck mechanism of said center part and said chuck mechanism of said peripheral fixed part.

7. A sample table for use in a pattern exposure machine, claimed in claim 3, wherein said peripheral part is divided into a peripheral fixed part and peripheral movable parts movable in a radial direction, said peripheral fixed part being integral with said center part, and the sample table includes means for controlling said chuck mechanism of said center part and said chuck mechanism of said peripheral fixed part, independently of each other.

8. A sample table for use in a pattern exposure machine, claimed in claim 3, wherein said peripheral part is divided into a plurality of radially located peripheral movable parts movable in a radial direction, and the sample table includes means for simultaneously controlling said chuck mechanism of said peripheral movable parts, and means for controlling the displacement of said peripheral movable parts in such a manner that the peripheral movable parts are displaced by respective predetermined distances.

9. A sample table for use in a pattern exposure machine, claimed in claim 8, wherein the displacement of each of said peripheral movable parts becomes different in accordance with a distance from a center of the sample table.

10. A sample table for use in a pattern exposure machine, claimed in claim 8, wherein said plurality of radially located peripheral movable parts are disposed in a radial grid configuration.

11. A sample table for use in a pattern exposure machine, claimed in claim 3, wherein the exposure machine is an X-ray exposure machine.

12. A sample table for use in a pattern exposure machine, claimed in claim 3, wherein said chuck mechanism is a vacuum chuck mechanism for vacuum-sucking said sample.

13. A sample table for use in a pattern exposure machine, claimed in claim 3, wherein said chuck mechanism is an electrostatic chuck mechanism for electrostatically attracting said sample.

14. A sample table for use in a pattern exposure machine, claimed in claim 3, wherein said sample table comprises a planar surface which supports the sample.

* * * * *